(12) United States Patent
Fujiwara

(10) Patent No.: US 6,400,622 B1
(45) Date of Patent: Jun. 4, 2002

(54) SEMICONDUCTOR MEMORY DEVICE

(75) Inventor: Atsushi Fujiwara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/983,076

(22) Filed: Oct. 23, 2001

(30) Foreign Application Priority Data

Oct. 26, 2000 (JP) ........................................ 2000-326599

(51) Int. Cl.[7] .............................. G11C 7/00; G11C 8/00
(52) U.S. Cl. ................. 365/200; 365/225.7; 365/230.03
(58) Field of Search ............................. 365/200, 225.7, 365/230.03, 230.06, 226

(56) References Cited

U.S. PATENT DOCUMENTS

| | | | |
|---|---|---|---|
| 4,975,882 A | 12/1990 | Kuo et al. ................... | 365/200 |
| 5,313,424 A | * 5/1994 | Adams et al. .............. | 365/200 |
| 5,367,484 A | * 11/1994 | Alexander et al. .......... | 365/200 |
| 5,469,390 A | * 11/1995 | Sasaki et al. ............... | 365/200 |
| 5,699,306 A | * 12/1997 | Lee et al. ................... | 365/200 |
| 6,058,053 A | * 5/2000 | Tsuji et al. ................. | 365/200 |

FOREIGN PATENT DOCUMENTS

JP          05-159597          6/1993

\* cited by examiner

Primary Examiner—Trong Phan
(74) Attorney, Agent, or Firm—McDermott, Will & Emery

(57) ABSTRACT

The semiconductor memory device, provided with a secondary regular memory region for storing a rewrite program and the like in addition to a primary regular memory region for storing data, includes a spare block decoder for enabling selection of a spare memory block and a register section for holding a signal that activates the spare block decoder. Whether the spare memory block is used as the secondary regular memory region or as a spare memory block for redundancy defect replacement is controlled with the signal held in the register section. In this way, the secondary regular memory region is provided without increasing the area.

7 Claims, 4 Drawing Sheets

SEMICONDUCTOR MEMORY DEVICE

BACKGROUND OF THE INVENTION

The present invention relates to a semiconductor memory device, and more particularly, to a semiconductor memory device that includes nonvolatile memory cells and is prepared to be able to perform redundancy defect replacement.

In recent years, the yield of flash memories as nonvolatile semiconductor memory devices tends to decrease with increase in memory capacity and improvement in fine fabrication process technology. To suppress the decrease of the yield, it has become essential to provide semiconductor memory devices that can replace effective memory cell with a spare memory cell (redundancy defect replacement).

The semiconductor memory devices as described above are disclosed. in Japanese Laid-Open Patent Publication No. 5-159597 and the like, for example. FIG. 5 schematically shows an example of such conventional semiconductor memory devices.

Referring to FIG. 5, a regular memory cell array 101 includes memory cells (denoted as MC in FIG. 5) arranged in a matrix to be connected to n regular word lines WL1 to WLn (n is a positive integer) and m bit lines BL1 to BLm (m is a positive integer). A spare memory cell array 102 includes memory cells connected to a word line WLn+1 and the bit lines BL1 to BLm. A redundancy control circuit 104 includes selection circuits Sa1 to San and control cells Ca1 to Can. The selection circuits Sa1 to San switch the connection of signal lines R1 to Rn extending from a row decoder 103 to the corresponding word lines WL1 to WLn+1. Each of the control cells Ca1 to Can includes a fuse element or a nonvolatile memory cell for storing defect information although not shown. The output lines from the control cells Ca1 to Can are connected to the corresponding selection circuits Sa1 to San and the adjacent control cells.

The operation of the semiconductor memory device having the construction described above will be described. The row decoder 103 decodes an input row address and outputs the results to the signal lines R1 to Rn. The selection circuits Sa1 to San perform switching based on the outputs of the control cells Ca1 to Can. Specifically, the i-th selection circuit Sai ($1 \leq i \leq n$) selects the word line WLi when the output of the control cell Cai is a low level ("L") and selects the word line WLi+1 when it is a high level ("H"), for example. The control cell Cai, in which defect information on the regular word line WLi has been stored, outputs "H" when the defect information indicates that the word line WLi has a defect or when the output of the control cell Cai−1 is "H", and otherwise outputs "L". For example, when a defective memory cell MC exists on the i-th word line WLi, defect information indicating this defect is stored in the control cell Cai. In this case, while any selection circuit Sak satisfying $1 \leq k < i$ selects the word line WLk for the signal line Rk, any selection circuit Saj satisfying $i \leq j \leq n$ selects the word line WLj+1 for the signal line Rj. In other words, the redundancy control circuit 104 shifts the connection of the i-th and subsequent selection circuits to the other word lines so that the defective word line WLi is skipped, to realize redundancy defect replacement.

The above conventional semiconductor memory device has the following problems. The spare memory cell array is used only in the event of replacement of a defect in the regular memory cell array. Therefore, if no such a replacement event has occurred, the spare memory cell array is just left unused while increasing the chip area.

Moreover, when a secondary regular memory region is required for storing a rewrite program in a nonvolatile semiconductor memory device, a memory cell array for the secondary regular memory region needs to be provided in addition to the regular memory cell array and the spare memory cell array. This disadvantageously increases the area of the device.

SUMMARY OF THE INVENTION

An object of the present invention is providing a semiconductor memory device capable of providing a secondary regular memory region without increasing the area of the device.

The semiconductor memory device of the present invention includes: a plurality of regular memory cell groups; at least one spare memory cell group arranged in succession to the plurality of regular memory cell groups; a plurality of regular memory cell group selection lines provided respectively for the plurality of regular memory cell groups; at least one spare memory cell group selection line provided for the spare memory cell group; a regular selection circuit connected with a plurality of address selection lines and receiving an address, the regular selection circuit selecting any of the plurality of address selection lines based on the address; a spare selection circuit connected with a spare selection line and receiving a spare selection signal, the spare selection circuit selecting the spare selection line based on the spare selection signal, the spare selection line being connectable with the spare memory cell group selection line; selective connecting means for connecting each of the plurality of address selection lines selectively to a corresponding regular memory cell group selection line among the plurality of regular memory cell group selection lines, at least one of the regular memory cell group selection lines arranged subsequent to the corresponding regular memory cell group selection line, or a spare memory cell group selection line of the spare memory cell group selection lines; a selection control cell group for controlling the selective connecting means so that the regular memory cell group selection lines corresponding to regular memory cell groups excluding a defective memory cell group among the plurality of regular memory cell groups and the spare memory cell group selection line are respectively connected to the plurality of address selection lines; and a register section for holding a spare use flag indicating whether or not the spare selection circuit should select the spare selection line. Whether or not the spare memory cell group is used as a secondary regular memory cell group is determined based on the spare use flag in the register section.

With the above construction, the spare memory cell group can be used for replacing a defective memory cell group or as a secondary regular memory cell group by being selected based on the spare selection signal.

According to the present invention, preferably, the register section outputs a spare selection flag signal based on the held spare use flag, and the spare selection circuit selects the spare selection line based on the spare selection signal when the spare selection flag signal is activated, and keeps the spare selection line in a non-selected state irrespective of the spare selection signal when the spare selection flag signal is inactivated.

With the above construction, control of preventing the spare memory cell group from being selected based on the spare selection signal is possible by use of the flag stored in the register section.

According to the present invention, preferably, the spare memory cell group includes a plurality of spare memory cell groups, and the spare memory cell group selection line includes a plurality of spare memory cell group selection lines respectively corresponding to the plurality of spare memory cell groups, and the device further comprises: spare selective connecting means for selectively connecting the spare selection line to a corresponding spare memory cell group selection line or a spare memory cell group selection line arranged subsequent to the corresponding spare memory cell group selection line; and a spare selection control cell for controlling the spare selective connecting means so that when the corresponding spare memory cell group selection line is used for replacing a defective memory cell group, the spare selection line is connected to the spare memory cell group selection line arranged subsequent to the corresponding spare memory cell group selection line.

With the above construction, it is possible to use part of the plurality of spare memory cell groups for replacing a defective memory cell group, and another part thereof as a secondary regular memory cell based on the spare selection signal.

According to the present invention, preferably, the register section includes spare use flag storing means including a fuse element or a nonvolatile memory cell, and the spare use flag is held in the spare use flag storing means.

With the above construction, the spare use flag can be easily set by programming the fuse element or the nonvolatile memory element.

According to the present invention, the semiconductor memory device further includes: a configuration information memory cell group provided in a common memory cell array with the regular memory cell groups and the spare memory cell group, the configuration information memory cell group including a nonvolatile memory cell for storing the spare use flag; a data read circuit for reading data stored in the memory cell array; and a read control circuit for controlling the data read circuit so that when the spare use flag is read from the configuration information memory cell group by the data read circuit, the read spare use flag is stored in the register section.

With the above construction, the spare use flag information can be written in a memory cell in the common array with the regular memory cells. Therefore, since the common read/write circuits can be used, the circuit scale can be reduced.

According to the present invention, preferably, the semiconductor memory device further includes: a power-on detection circuit for detecting turning on of a power, wherein the read control circuit operates at turning on of the power in response to an output of the power-on detection circuit.

With the above construction, the spare use flag can be set properly only by turning on the power.

According to the present invention, preferably, each of the regular memory cell groups and the spare memory cell group includes nonvolatile memory cells.

With the above construction, the spare memory cell group composed of nonvolatile memory cells can be used as a secondary regular memory region for storing a rewrite program.

DESCRIPTION OF THE PREFERRED EMBODIMENTS

Hereinafter, preferred embodiments of the present invention will be described with reference to the accompanying drawings.

Embodiment 1

Figure 1:
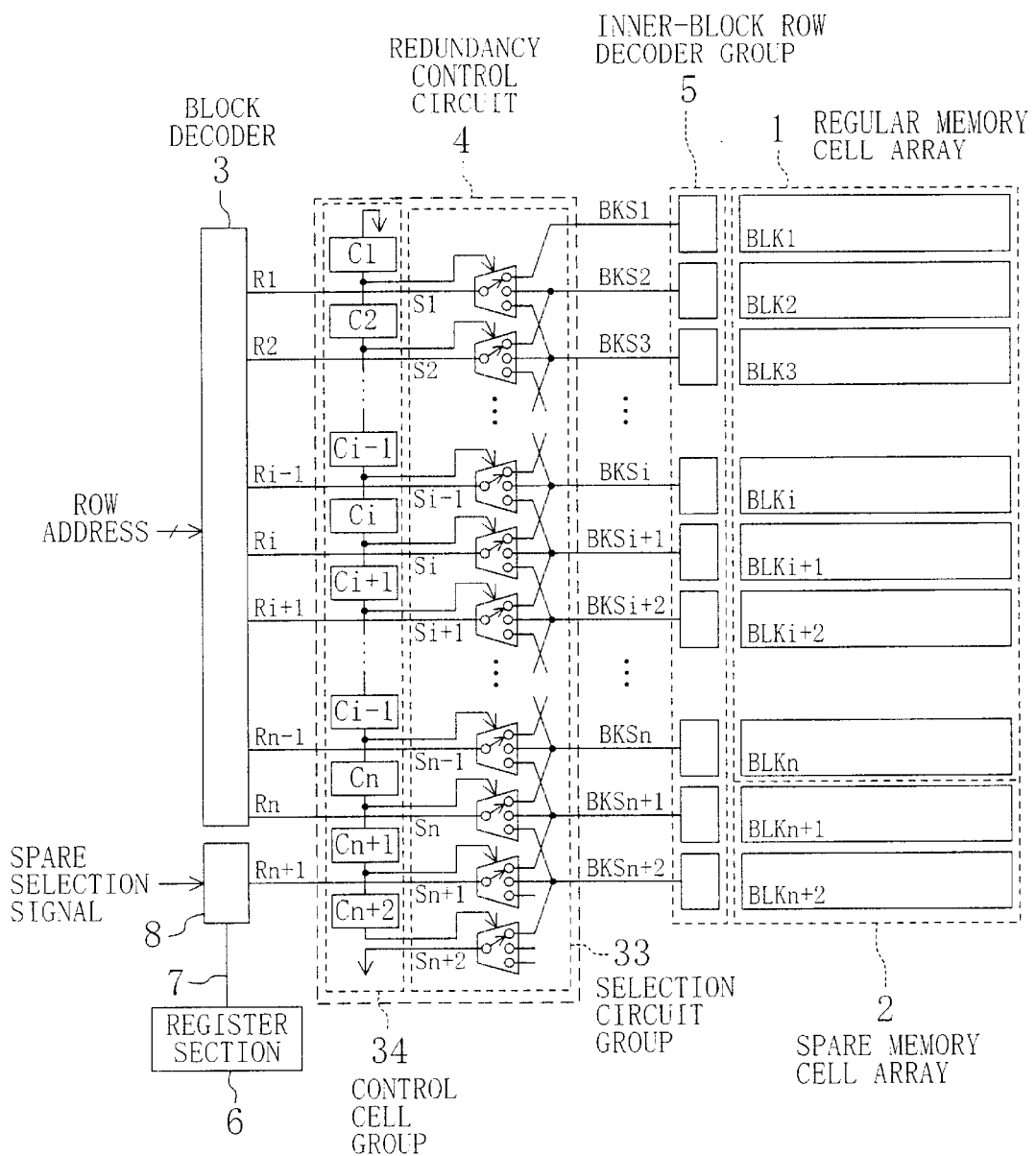
FIG. 1 is a view showing the entire structure of a semiconductor memory device of Embodiment 1 of the present invention.

FIG. 1 shows the entire construction of a semiconductor memory device of Embodiment 1 of the present invention. Referring to FIG. 1, a regular memory cell array 1 is constructed of regular memory blocks BLK1 to BLKn arranged in sequential order, each of which includes a plurality of rewritable nonvolatile memory cells arranged in a matrix. A spare memory cell array 2 is constructed of spare memory blocks BLKn+1 and BLKn+2 arranged in sequential order, each of which includes a plurality of nonvolatile memory cells as those described above arranged in a matrix. Data write/erase is possible for each of the spare memory blocks BLKn+1 and BLKn+2 individually. A block decoder 3 decodes a block address included in an input row address and outputs the results to output signal lines R1 to Rn (address selection lines) arranged in sequential order.

A register section 6 holds a spare use flag indicating whether or not any spare memory block is used as a secondary regular memory region, and outputs the flag to a spare use signal line 7. A spare block decoder 8 receives a spare use signal supplied through the spare use signal line 7 and a spare selection signal output at a predetermined timing. When the spare use signal is not supplied, the spare block decoder 8 is permitted to decode the spare selection signal and output the decoded results to an output signal line Rn+1 (spare selection line). However, when the spare use signal is supplied, the spare block decoder 8 is prohibited from decoding the spare selection signal and outputting the results to the output signal line Rn+1.

A redundancy control circuit 4 controls the connection between the output signal lines R1 to Rn+1 and block selection signal lines BKS1 to BKSn+2. An inner-block row decoder group 5 selects word lines in the regular memory blocks BLK1 to BLKn and the spare memory blocks BLKn+1 and BLKn+2 based on block selection signals supplied through the block selection signal lines BKS1 to BKSn+2 from the redundancy control circuit 4 and the address (not shown).

The redundancy control circuit 4 includes a selection circuit group 33 and a control cell group 34. The selection circuit group 33 includes selection circuits S1 to Sn+1 respectively connected with the output signal lines R1 to Rn+1 extending from the block decoder 3 and the spare block decoder 8, and switch the connection of the output signal lines R1 to Rn+1 to the corresponding block selection lines BKS1 to BKSn+2. Specifically, each of the selection circuits S1 to Sn+1 connects the corresponding output signal line R1 to Rn+1 to either the block selection signal line having the same ordinal number as the corresponding output signal line or one of the two block selection signal lines arranged subsequent to the corresponding block selection signal line (one block selection signal line in the case of the selection circuit Sn+1). For example, the i-th output signal line Ri connected; with the i-th selection circuit Si is connected to either one of the i-th, i+1-th, and i+2-th block selection signal lines BKSi, BKSi+1, and BKSi+2. The control cell group 34 includes control cells C1 to Cn+2 that hold defect information on the memory blocks BLK1 to BLKn+2. The control cells C1 to Cn+2 are connected to the corresponding selection circuits S1 to Sn+2 and also to one another sequentially in the order of the arrangement of the block selection signal lines, and output one of three states "0", "1", and "2" for control of the selection circuits S1 to Sn+2.

Figure 2:
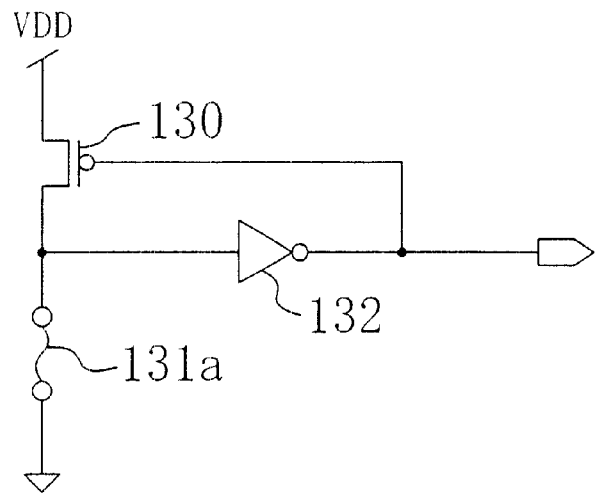
FIG. 2 is a view showing an example of a register section of the semiconductor memory device of Embodiment 1.

FIG. 2 is a circuit diagram of an example of the register section 6 shown in FIG. 1, which includes a fuse element;131a as a data write means. A p-type MOS transistor 130 has a source connected to the supply voltage VDD and a drain connected to the input of an inverter 132 and also grounded via the fuse element 131a. The output of the inverter 132 is input into the gate of the p-type MOS transistor 130 and also serves as the output of the register section 6. As long as the fuse element 131a is in conduction, the inverter 132 invariably outputs "1" and thus the p-type MOS transistor 130 is invariably off. once the fuse element 131a blows., the inverter 132 outputs "0" and thus the p-type MOS transistor 130 is turned on.

Figure 3:
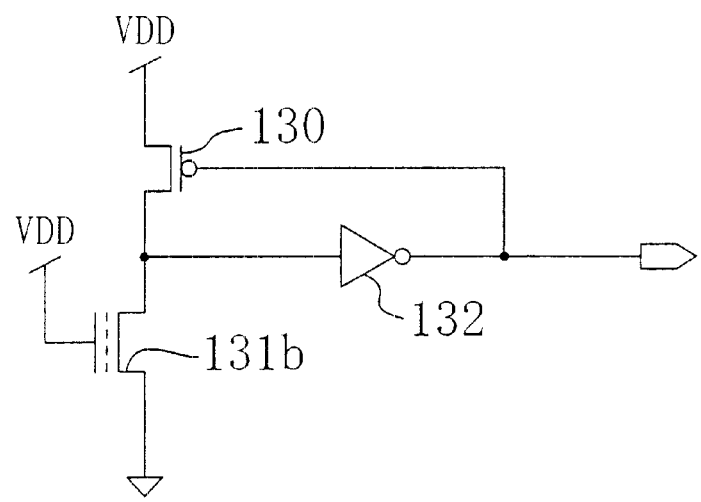
FIG. 3 is a view showing another example of the register section of the semiconductor memory device of Embodiment 1.

FIG. 3 is a circuit diagram of another example of the register section 6 shown in FIG. 1, which uses a nonvolatile memory element 131b as a data write means in place of the fuse element 131a in FIG. 2. In FIG. 3, the same or corresponding components are denoted by the same reference numerals as those in FIG. 2. The circuit of FIG. 3 has the same construction as that of FIG. 2 except that the nonvolatile memory element 131b is turned on or off by changing a charge held in the memory element, instead of blowing the fuse element.

Any other construction may be adopted as the register section 6 as long as it can hold and output a bit of data.

The operation of the semiconductor memory device of this embodiment having the above construction will be described.

First, the operation relating to redundancy defect replacement will be described. The block decoder 3 decodes an input row address and outputs the results to the output signal lines R1 to Rn. The selection circuits S1 to Sn switch the connection between the output signal lines R1 to Rn from the block decoder 3 and the block selection signal lines BKS1 to BKSn+2 based on the outputs of the control cells C1 to Cn. Specifically, the i-th selection circuit Si selects the block selection signal line BKSi when the output of the control cell Ci is "0", the block selection signal line BKSi+1 when it is "1", and the block selection signal line BKSi+2 when it is "2". The defect information Di (not shown) on the memory block BLKi held in the control cell Ci is "1" when a defect exists and "0" when no defect exists. The control cell Ci outputs the state information received from the, control cell Ci-1 as it is when the defect information Di and the next defect information Di+1 satisfy (Di, Di+1)=("0", "0"). In the case of (Di, Di+1)=("1", "0"), the control cell Ci outputs state "1" when the output of the control cell Ci-1 is state "0". In the case of (Di, Di+1)=("0", "1"), the control cell Ci outputs state "0" when the output of the control cell Ci-1 is state "0", and state "2" when the output of the control cell Ci-1 is state "1". In the case of (Di, Di+1)=("1", "1"), the control cell Ci outputs state "2" when the output of the control cell Ci-1 is state "0". By this control, the connection of the selection circuits to the block selection signal lines is shifted so that a defective block selection signal line is skipped. The block selection signal lines excluding the defective block selection signal line are then connected with the output signal lines R1 to Rn sequentially in the order of arrangement. In this way, defect replacement using the spare block selection signal lines is realized.

Next, the operation of selecting the spare memory block as a secondary regular memory region will be described.

When, the spare use flag held in the register section 6 is "0", "0" is output to the spare use signal line 7, and thus the value of the output signal line Rn+1 from the spare block decoder 8 keeps "0". Therefore, the spare memory blocks BLKn+1 and BLKn+2 are prevented from being selected even when the spare selection signal is input into the spare block decoder 8. The spare memory blocks are made selectable only in the event of redundancy defect replacement. For example, when one block is to be replaced, the output signal line Rn from the block decoder 3 and the block selection signal line BKSn+1 are connected via the selection circuit Sn to allow selection of the spare memory block BLKn+1. When two blocks are to be replaced, the output signal line Rn-1 from the block decoder 3 and the block selection signal line BKSn+1 are connected via the selection circuit Sn-1, and also the output signal line Rn from the block decoder 3 and the block selection signal line BKSn+2 are connected via the selection circuit Sn, to allow selection of the spare memory blocks BLKn+1 and BLKn+2.

When the spare use flag held in the register section 6 is "1", "1" is output to the spare use signal line 7, and thus the value of the output signal line Rn+1 from the spare block decoder 8 is "0" when the spare selection signal is "0" and "1" when it is "1". This enables the spare memory block BLKn+1 to be selected based on the spare selection signal, and thus rewrite/read is made possible for the spare block BLKn+1 as the secondary regular memory region. The spare memory block. BLKn+2 can only be selected when redundancy defect replacement has been performed. That is, when one block has been replaced, the output signal line Rn+1 from the spare block decoder 8 and the block selection signal line BKSn+2 are connected via the selection circuit Sn+1, to allow selection of the spare memory block BLKn+2. In this case, the spare memory block BLKn+2 is selected as the secondary regular memory region.

As described above, in this embodiment, replacement of up to two defective blocks is possible using the spare memory blocks BLKn+1 and BLKn+2. In addition, when a secondary regular memory region is required, the memory device can be shifted to the construction in which one of the spare memory blocks BLKn+1 and BLKn+2 is dedicated to the secondary regular memory region and redundancy replacement of up to one defective block is possible, with only the setting of the register section 6. This eliminates the necessity of providing an additional memory cell array for the secondary regular memory region and thus enables reduction of the area. Since the shift of the construction is possible only with the setting of the register section 6, design change is not required, which may otherwise be required to reflect a construction necessary or unnecessary for the secondary regular memory region.

In this embodiment, the two spare memory blocks BLKn+1 and BLKn+2 were used. Alternatively, the number of spare memory blocks may be one, or three or more. In the case of using only one spare memory block, redundancy defect replacement is not available when the spare memory block is used as the secondary regular memory region.

Embodiment 2

Figure 4:
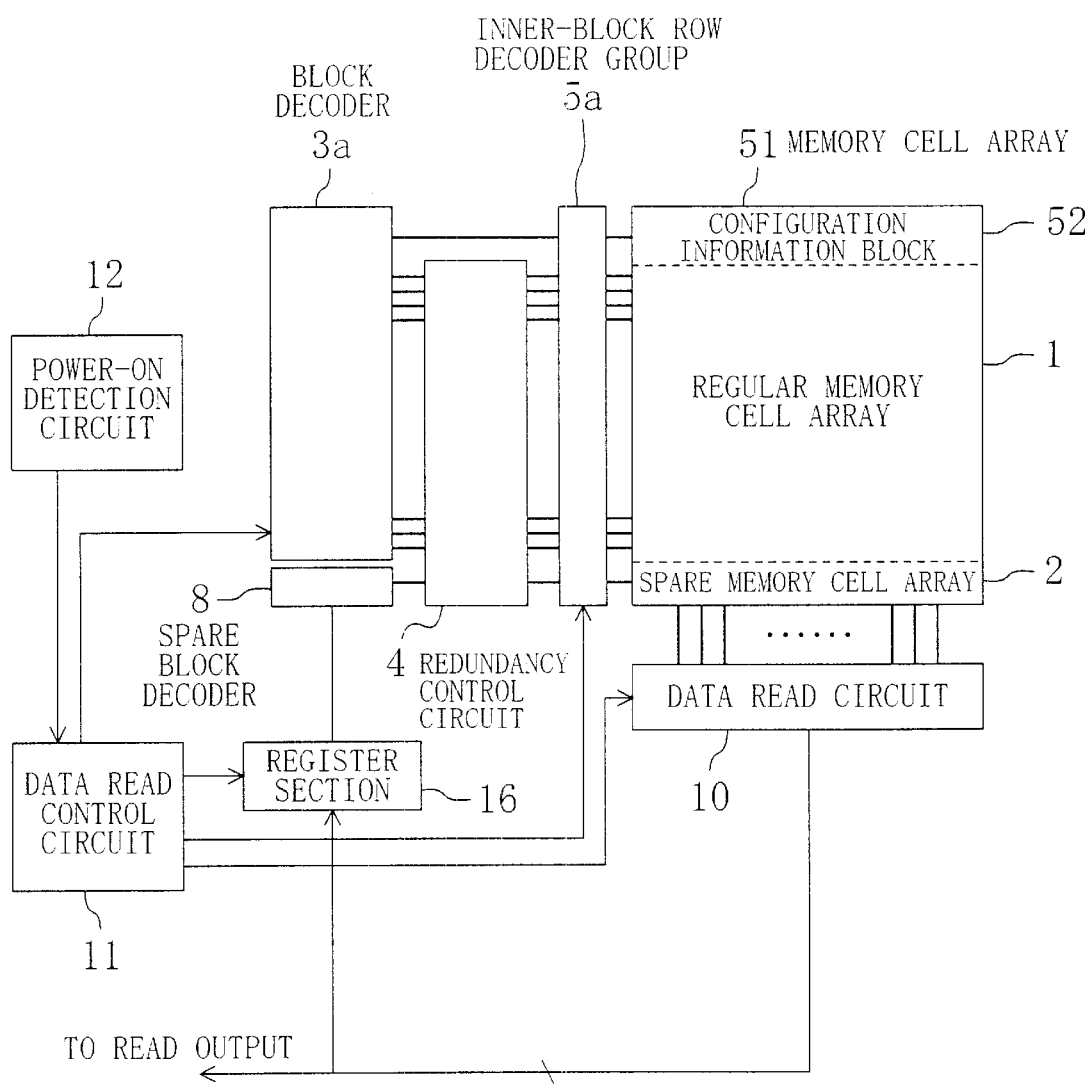
FIG. 4 is a view showing the entire structure of a semiconductor memory device of Embodiment 2 of the present invention.
Figure 5:
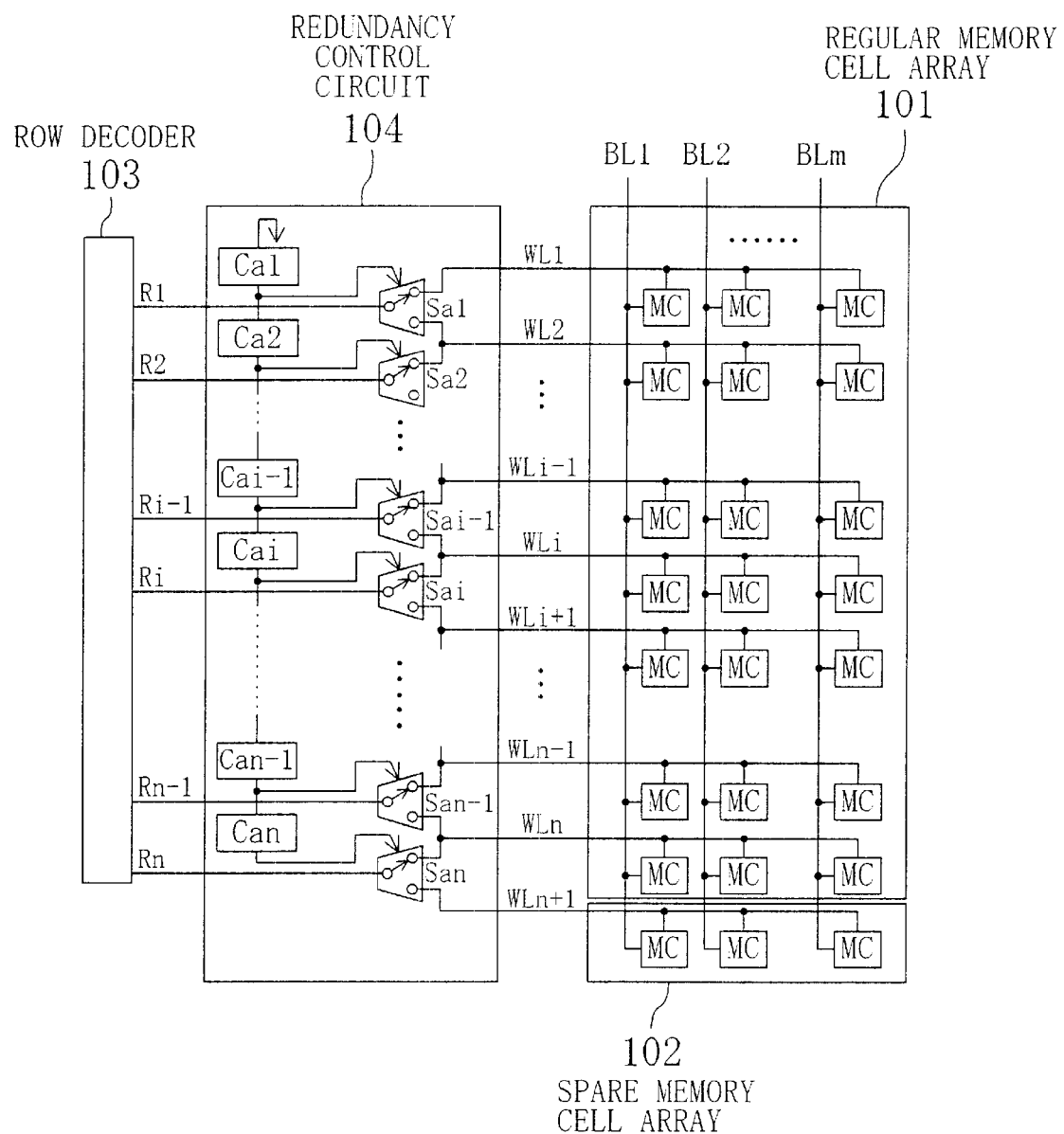
FIG. 5 is a view showing the construction of a conventional semiconductor memory device.

FIG. 4 is a block diagram showing the entire construction of a semiconductor memory device of Embodiment 2 of the present invention. In this embodiment, information on the spare use flag is stored in the memory cell array.

In FIG. 4, the same or corresponding components are denoted by the same reference numerals as those in FIG. 1. Referring to FIG. 4, a memory cell array 51 includes a configuration information block 52, a regular memory cell array 1, and a spare memory cell array 2. The configuration information block 52 includes nonvolatile memory cells arranged in a matrix for storing information including the spare use flag. A block decoder 3a and an inner-block row decoder group 5a are constructed to have a function of selecting the configuration information block 52 by decoding a row address, in addition to the functions of the block decoder 3 and the inner-block row decoder group 5 shown in FIG. 1. A redundancy control circuit 4 performs redundancy defect replacement for regular memory blocks in the regular memory cell array 1 and spare memory blocks in the spare memory cell array 2. A register section 16 is different from the register section 6 shown in FIG. 1 in that the former captures the spare use flag read from the configuration information block 52 and holds it therein.

A data read circuit 10 includes a sense amplifier and a column selection circuit (not shown) for reading data stored in the memory cell array 51. A data read control circuit 11 controls the entire memory device when data in the configuration information block 52 is read. Specifically, in response to the output of a power-on detection circuit 12 at the turning on of the power, the data read control circuit 11 instructs the block decoder 3a and the inner-block row decoder group 5a to select a memory cell in the configuration information block 52, captures relevant data from the data read circuit 10, and sets the spare use flag in the register section 16.

The operation of the semiconductor memory device of this embodiment having the above construction will be described. The process of setting the spare use flag in the register section 16 is controlled by the data read control circuit 11. The spare use flag is read from the configuration information block 52 by the block decoder 3a, the inner-block row decoder group 5a, and the data read circuit 10. The spare use flag output from the data read circuit 10 is transferred to the register section 16. Thereafter, using the spare use flag held in the register section 16, the operation described above with reference to FIG. 1 is performed. That is, by the spare block decoder 8 and the redundancy control circuit 4, it is determined whether the spare memory block is used as the secondary regular memory region or as the memory block for redundancy defect replacement.

As described above, in this embodiment, the configuration information block 52 for storing a spare use flag is formed in the memory cell array 51, and thus controlled by the common circuit system with the regular memory cell array 1 that is the regular memory region of the memory cell array 51. This eliminates the necessity of providing write/read circuits for the memory cell for storing the spare use flag separately from write/read circuits for the memory cell array 51. Therefore, the circuit scale can be reduced, and thus the area can be reduced. Moreover, testing of the memory cells of the configuration information block 52 can be done in the same process as that of the regular memory cell array 1. This simplifies the test.

Thus, in the semiconductor memory device of the present invention,l whether the spare memory cell array is used as the secondary regular memory region or as the memory region for redundancy defect replacement can be changed by the setting of the register section. Therefore, there is no increase in area when the secondary regular memory region is required. When no secondary regular memory region is required, all the spare memory cells can be used as the memory region for redundancy defect replacement. This increases the yield.

While the present invention has been described in a preferred embodiment, it will be apparent to those skilled in the art that the disclosed invention may be modified in numerous way s and may assume many embodiments other than that specifically set out and described above. Accordingly, it is intended by the appended claims to cover all modifications of the invention that fall within the true spirit and scope of the invention.

What is claimed is:

1. A semiconductor memory device comprising:
   a plurality of regular memory cell groups;
   at least one spare memory cell group arranged in succession to the plurality of regular memory cell groups;
   a plurality of regular memory cell group selection lines provided respectively for the plurality of regular memory cell groups;
   at least one spare memory cell group selection line provided for the spare memory cell group;
   a regular selection circuit connected with a plurality of address selection lines and receiving an address, the regular selection circuit selecting any of the plurality of address selection lines based on the address;
   a spare selection circuit connected with a spare selection line and receiving a spare selection signal, the spare selection circuit selecting the spare selection line based on the spare selection signal, the spare selection line being connectable with the spare memory cell group selection line;
   selective connecting means for connecting each of the plurality of address selection lines selectively to a corresponding regular memory cell group selection line among the plurality of regular memory cell group selection lines, at least one of the regular memory cell group selection lines arranged subsequent to the corresponding regular memory cell group selection line, or a spare memory cell group selection line of the spare memory cell group selection lines;
   a selection control cell group for controlling the selective connecting means so that the regular memory cell group selection lines corresponding to regular memory cell groups excluding a defective memory cell group among the plurality of regular memory cell groups and the spare memory cell group selection line are respectively connected to the plurality of address selection lines; and
   a register section for holding a spare use flag indicating whether or not the spare selection circuit should select the spare selection line,
   wherein whether or not the spare memory cell group is used as a secondary regular memory cell group is determined based on the spare use flag in the register section.

2. The,semiconductor memory device of claim 1, wherein the register section outputs a spare selection flag signal based on the spare use flag, and
   the spare selection circuit selects the spare selection line based on the spare selection signal when the spare selection flag signal is activated, and keeps the spare selection line in a non-selected state irrespective of the spare selection signal when the spare selection flag signal is inactivated.

3. The semiconductor memory device of claim 1, wherein the spare memory cell group includes a plurality of spare memory cell groups, and the spare memory cell group selection line includes a plurality of spare memory cell group selection lines respectively corresponding to the plurality of spare memory cell groups, and the device further comprises:

spare selective connecting means for selectively connecting the spare selection line to a corresponding spare memory cell group selection line or a spare memory cell group selection line arranged subsequent to the corresponding spare memory cell group selection line; and a spare selection control cell for controlling the spare selective connecting means so that when the corresponding spare memory cell group selection line is used for replacing a defective: memory cell group, the spare selection line is connected to the spare memory cell group selection line arranged subsequent to the corresponding spare memory cell group selection line.

4. The semiconductor memory device of claim 1, wherein the register section includes spare use flag storing means including a fuse element or a nonvolatile memory cell, and the spare use flag is held in the spare use flag storing means.

5. The semiconductor memory device of claim 1, further comprising:

a configuration information memory cell group provided in a common memory cell array with the regular memory cell groups and the spare memory cell group, the configuration information memory cell group including a nonvolatile memory cell for storing the spare use flag;

a data read circuit for reading data stored in the memory cell array; and a read control circuit for controlling the data read circuit so that when the spare use flag is read from the configuration information memory cell group by the data read circuit, the read spare use flag is stored in the register section.

6. The semiconductor memory device of claim 5, further comprising:

a power-on detection circuit for detecting turning on of a power, wherein the read control circuit operates at turning on of the power in response to an output of the power-on detection circuit.

7. The semiconductor memory device of claim 1, wherein each of the regular memory cell groups and the spare memory cell group includes nonvolatile memory cells.

* * * * *